(12) United States Patent
Kim et al.

(10) Patent No.: US 11,903,208 B2
(45) Date of Patent: Feb. 13, 2024

(54) SEMICONDUCTOR MEMORY DEVICE AND MANUFACTURING METHOD OF THE SEMICONDUCTOR MEMORY DEVICE

(71) Applicant: SK hynix Inc., Icheon-si (KR)

(72) Inventors: Nam Kuk Kim, Yongin-si (KR); Nam Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 51 days.

(21) Appl. No.: 17/841,348

(22) Filed: Jun. 15, 2022

(65) Prior Publication Data

US 2022/0310653 A1 Sep. 29, 2022

Related U.S. Application Data

(62) Division of application No. 16/787,517, filed on Feb. 11, 2020, now Pat. No. 11,393,842.

(30) Foreign Application Priority Data

Jul. 26, 2019 (KR) .......................... 10-2019-0091231

(51) Int. Cl.
*H10B 43/27* (2023.01)
*H10B 63/00* (2023.01)
*H10N 70/20* (2023.01)

(52) U.S. Cl.
CPC ............. *H10B 43/27* (2023.02); *H10B 63/30* (2023.02); *H10N 70/231* (2023.02)

(58) Field of Classification Search
None
See application file for complete search history.

(56) References Cited

U.S. PATENT DOCUMENTS

| | | |
|---|---|---|
| 9,824,966 B1 | 11/2017 | Kanakamedala et al. |
| 2017/0025421 A1 | 1/2017 | Sakakibara et al. |
| 2017/0154892 A1 | 6/2017 | Oh et al. |
| 2017/0213843 A1 | 7/2017 | Choi |
| 2018/0175053 A1 | 6/2018 | Park et al. |
| 2018/0366486 A1 | 12/2018 | Hada et al. |
| 2019/0157291 A1 | 5/2019 | Kam et al. |
| 2020/0395379 A1 | 12/2020 | Lee et al. |

FOREIGN PATENT DOCUMENTS

| | | |
|---|---|---|
| CN | 107046037 A | 8/2017 |
| CN | 108022928 A | 5/2018 |
| CN | 108140643 A | 6/2018 |
| CN | 109148457 A | 1/2019 |
| CN | 109273447 A | 1/2019 |
| CN | 109671711 A | 4/2019 |
| KR | 1020190107975 A | 9/2019 |
| KR | 1020200141807 A | 12/2020 |
| WO | 2015038246 A2 | 3/2015 |

*Primary Examiner* — Sarah K Salerno

(74) *Attorney, Agent, or Firm* — William Park & Associates Ltd.

(57) ABSTRACT

A semiconductor memory device and a method of manufacturing the semiconductor memory device are provided. The semiconductor memory device includes a doped semiconductor pattern including a body portion and a first protrusion protruding from the body portion in a first direction, a first channel pattern disposed on a top surface of the first protrusion and extending in the first direction, a first memory pattern surrounding a sidewall of the first channel pattern and extending on a sidewall of the first protrusion, and interlayer insulating layers and conductive patterns alternately stacked on each other in the first direction.

9 Claims, 14 Drawing Sheets

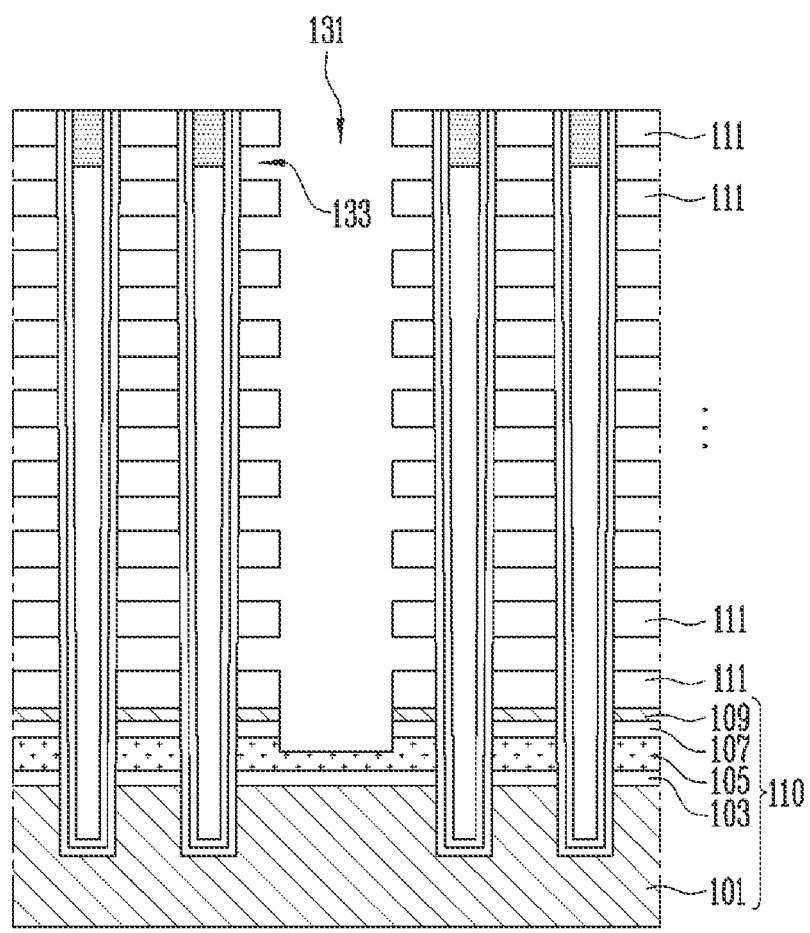

SEMICONDUCTOR MEMORY DEVICE AND MANUFACTURING METHOD OF THE SEMICONDUCTOR MEMORY DEVICE

CROSS-REFERENCE TO RELATED APPLICATION

The present application is a divisional application of U.S. patent application Ser. No. 16/787,517, filed on Feb. 11, 2020, and claims priority under 35 U.S.C. § 119(a) to Korean patent application number 10-2019-0091231, filed on Jul. 26, 2019, which is incorporated herein by reference in its entirety.

BACKGROUND

1. Technical Field

Various embodiments relate generally to a semiconductor memory device and a manufacturing method of the semiconductor memory device, and more particularly, to a three-dimensional semiconductor memory device and a manufacturing method of the three-dimensional semiconductor memory device.

2. Related Art

A memory cell array of a semiconductor memory device may include memory cells arranged in various structures. Three-dimensional semiconductor memory devices including three-dimensionally arranged memory cells have been proposed to increase integration density of a semiconductor device.

SUMMARY

According to an embodiment, a semiconductor memory device may include a doped semiconductor pattern including a body portion and a first protrusion protruding from the body portion in a first direction, a first channel pattern disposed on a top surface of the first protrusion and extending in the first direction, a first memory pattern surrounding a sidewall of the first channel pattern extended to surround a sidewall of the first protrusion, and interlayer insulating layers and conductive patterns alternately stacked on each other in the first direction. Each of the interlayer insulating layers and the conductive patterns may surround the first memory pattern.

According to an embodiment, a method of manufacturing a semiconductor memory device may include forming a lower stack structure including a first semiconductor layer and a sacrificial layer which is disposed over the first semiconductor layer and forming a channel layer extending from an inside of the first semiconductor layer to pass through the sacrificial layer and having a sidewall and a bottom surface covered by a memory layer. The channel layer may protrude farther than the lower stack structure. The method of manufacturing the semiconductor memory device may also include forming a gate stack structure on the lower stack structure to surround the channel layer, removing the sacrificial layer to expose a part of the memory layer between the gate stack structure and the first semiconductor layer, removing the part of the memory layer to separate the memory layer into a first memory pattern between the gate stack structure and the channel layer and a second memory pattern between the first semiconductor layer and the channel layer, and replacing a part of the channel layer exposed between the first memory pattern and the second memory pattern by a doped semiconductor pattern.

BRIEF DESCRIPTION OF THE DRAWINGS

FIGS. 5A, 5B, 5C, and 5D are cross-sectional diagrams illustrating an embodiment regarding steps ST1 and ST3 shown in FIG. 4;

DETAILED DESCRIPTION

Hereinafter, specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Various embodiments provide a semiconductor memory device capable of improving operational reliability of a three-dimensional semiconductor memory device, and a method of manufacturing the semiconductor memory device.

Figure 1:
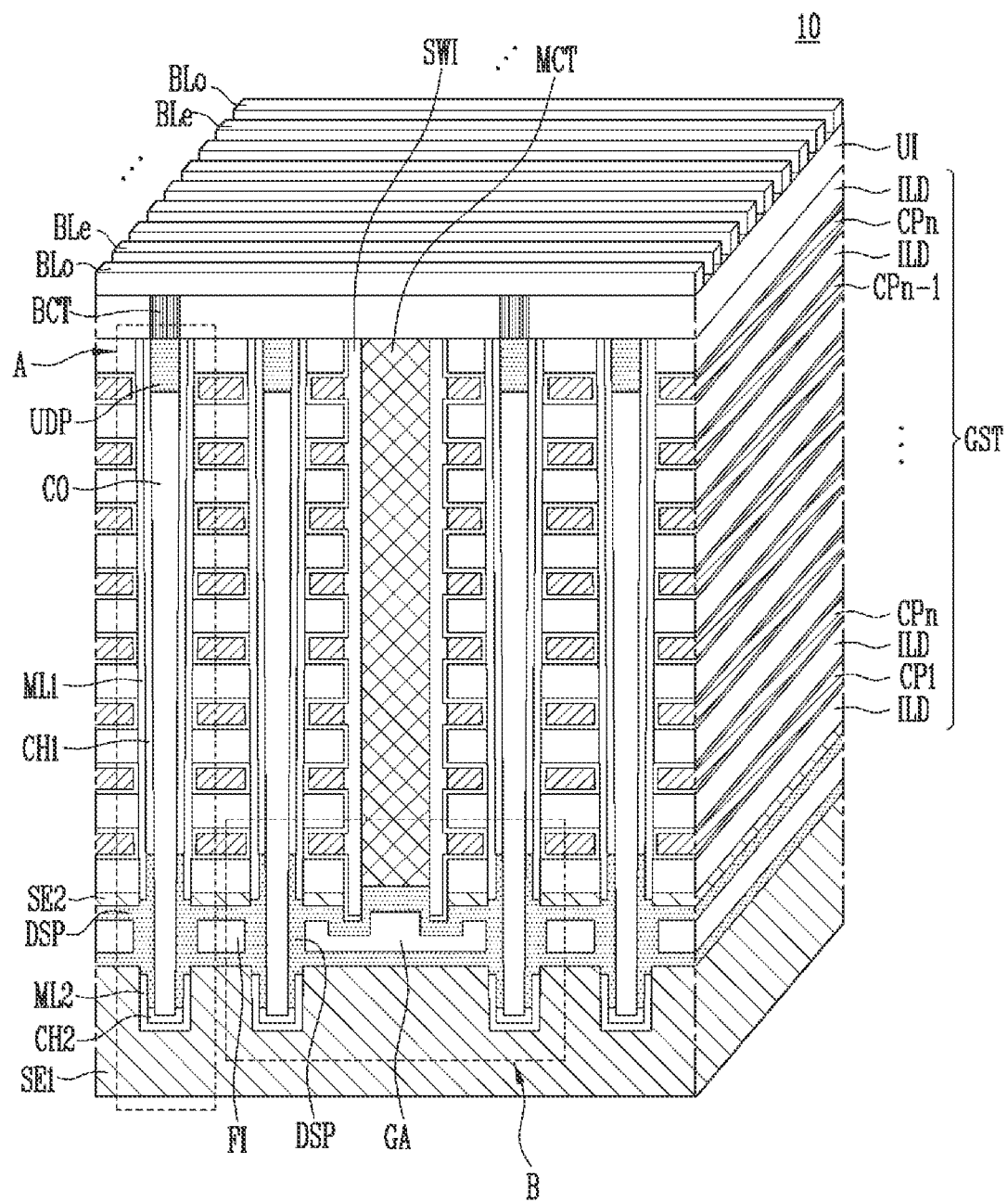
FIG. 1 is a perspective view illustrating a semiconductor memory device according to an embodiment.

FIG. 1 is a perspective view illustrating a semiconductor memory device 10 according to an embodiment.

Referring to FIG. 1, the semiconductor memory device 10 may include a gate stack structure GST disposed between a first semiconductor layer SE1 and bit lines BL, memory strings A coupled to the gate stack structure GST, and a doped semiconductor pattern DSP coupled to the first semiconductor layer SE1.

The first semiconductor layer SE1 may include a doped semiconductor layer or an undoped semiconductor layer. The first semiconductor layer SE1 as a doped semiconductor layer may include at least one of an n-type dopant or a p-type dopant. For example, the first semiconductor layer SE1 may include a p-type dopant to supply holes to a channel area during an erase operation of a semiconductor memory device. According to an embodiment, the first semiconductor layer SE1 may include a doped silicon layer.

The gate stack structure GST may include interlayer insulating layers ILD and conductive patterns CP1 to CPn alternately stacked on each other in a first direction towards bit lines BLo and BLe from the first semiconductor layer SE1. The conductive patterns CP1 to CPn may serve as gate electrodes of the memory string A.

Each of the memory strings A may include a first memory pattern ML1 surrounded by the gate stack structure GST and a first channel pattern CH1 surrounded by the first memory pattern ML1. The first memory pattern ML1 may include a material capable of storing data. The first channel pattern CH1 may serve as a channel area of a corresponding memory string. The first channel pattern CH1 may include a semiconductor layer. According to an embodiment, the first channel pattern CH1 may include a silicon layer. The first memory pattern ML1 may extend farther towards the first semiconductor layer SE1 than the first channel pattern CH1.

The central area of the first channel pattern CH1 may be filled with a core insulating layer CO and an upper doped semiconductor pattern UDP. The upper doped semiconductor pattern UDP may be surrounded by an upper end of the first channel pattern CH1 and disposed on the core insulating layer CO. The upper doped semiconductor pattern UDP may include a conductive dopant. For example, the upper doped semiconductor pattern UDP may include an n-type dopant. According to an embodiment, the upper doped semiconductor pattern UDP may include doped silicon. The upper doped semiconductor pattern UDP may serve as a drain junction.

The core insulating layer CO may extend into the first semiconductor layer SE1. A lower end of the core insulating layer CO may be surrounded by a second channel pattern CH2 and a second memory pattern ML2.

The second channel pattern CH2 may include the same material as the first channel pattern CH1. The second channel pattern CH2 may be disposed on the bottom surface of the core insulating layer CO. The second channel pattern CH2 may extend on the sidewall of the lower end of the core insulating layer CO.

The second memory pattern ML2 may include the same material as the first memory pattern ML1. The second memory pattern ML2 may be disposed on the surface of the second channel pattern CH2 and may extend farther towards the first channel pattern CH1 than the second channel pattern CH2.

The gate stack structure GST may be covered by an upper insulating layer UI. The bit lines BLo and BLe may be disposed on the upper insulating layer UI. Each of the bit lines BLo and BLe may include a conductive material to supply an electrical signal to a corresponding memory string. The bit lines BLo and BLe may include the odd bit line BLo and the even bit line BLe alternately disposed with each other in one direction. A pair of the odd bit line BLo and the even bit line BLe adjacent to each other may be respectively coupled to a first memory string and a second memory string which are adjacent to each other in a direction in which the odd bit line BLo and the even bit line BLe extend. A bit line contact plug BCT passing through the upper insulating layer UI may be coupled between the upper doped semiconductor pattern UDP of a corresponding memory string and a corresponding bit line.

The sidewall of the gate stack structure GST may be covered by a sidewall insulating layer SWI.

The doped semiconductor pattern DSP may be disposed between the gate stack structure GST and the first semiconductor layer SE1. The doped semiconductor pattern DSP may include a conductive dopant. For example, the doped semiconductor pattern DSP may include an n-type dopant. According to an embodiment, the doped semiconductor pattern DSP may include doped silicon. The doped semiconductor pattern DSP may serve as a source junction.

The doped semiconductor pattern DSP may extend towards the bottom surface of the first memory pattern ML1 and the bottom surface of the first channel pattern CH1. The doped semiconductor pattern DSP may extend towards the top surface of the second memory pattern ML2 and the top surface of the second channel pattern CH2. The doped semiconductor pattern DSP may extend on the sidewall insulating layer SWI.

According to an embodiment, the semiconductor memory device 10 may further include a second semiconductor layer SE2 disposed between the gate stack structure GST and the doped semiconductor pattern DSP. In other embodiments, the second semiconductor layer SE2 may be omitted. The second semiconductor layer SE2 may have a different etch rate from a material layer included in each of the first memory pattern ML1 and the second memory pattern ML2. For example, the second semiconductor layer SE2 may include a material having a different etch rate from a nitride layer and an oxide layer. According to an embodiment, the second semiconductor layer SE2 may include silicon. The second semiconductor layer SE2 may be a doped layer including various impurities such as an n-type impurity, a p-type impurity, or carbon, or may be an undoped layer.

A gap GA may be defined by the doped semiconductor pattern DSP between the first semiconductor layer SE1 and the second semiconductor layer SE2 or between the first semiconductor layer SE1 and the gate stack structure GST. The gap GA may be filled with an insulating material or may include an air gap.

The doped semiconductor pattern DSP may be in contact with the first semiconductor layer SE1 and the second semiconductor layer SE2.

A metal contact pattern MCT may be disposed on the doped semiconductor pattern DSP. The metal contact pattern MCT may include various conductive materials such as a metal silicide layer or a metal layer. However, embodiments are not limited thereto. According to another embodiment, an insulating material may be disposed on the doped semiconductor pattern DSP.

Figure 2A:
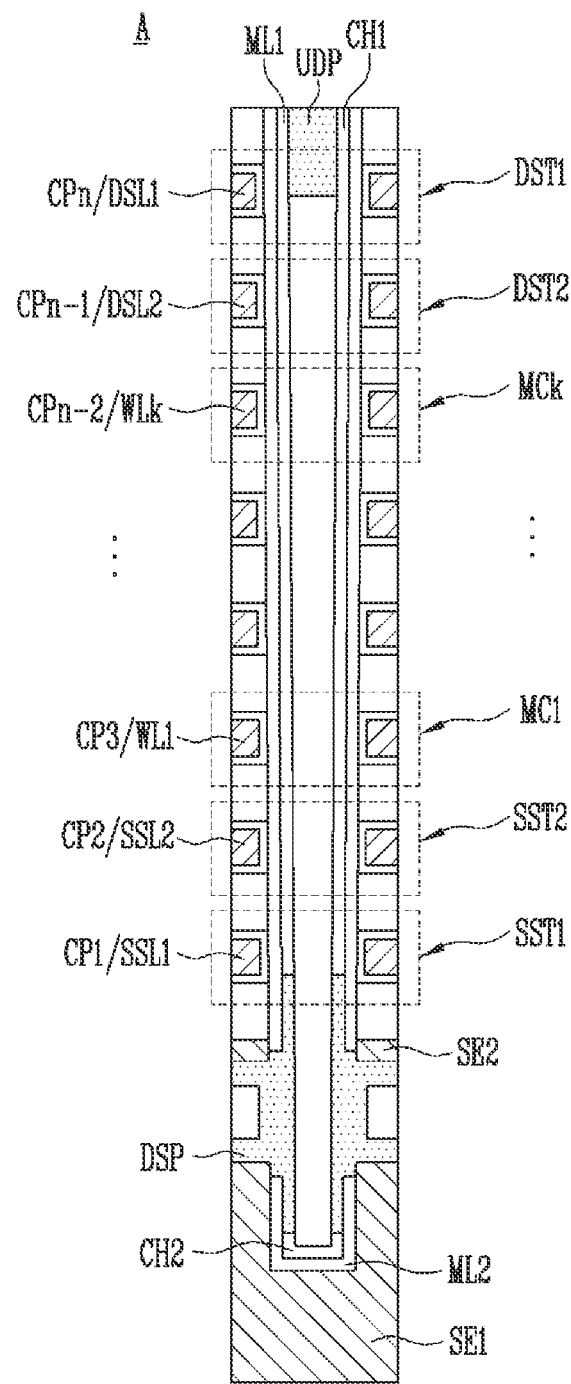
FIGS. 2A and 2B are cross-sectional diagrams illustrating a part of the semiconductor memory device shown in FIG. 1.
Figure 2B:
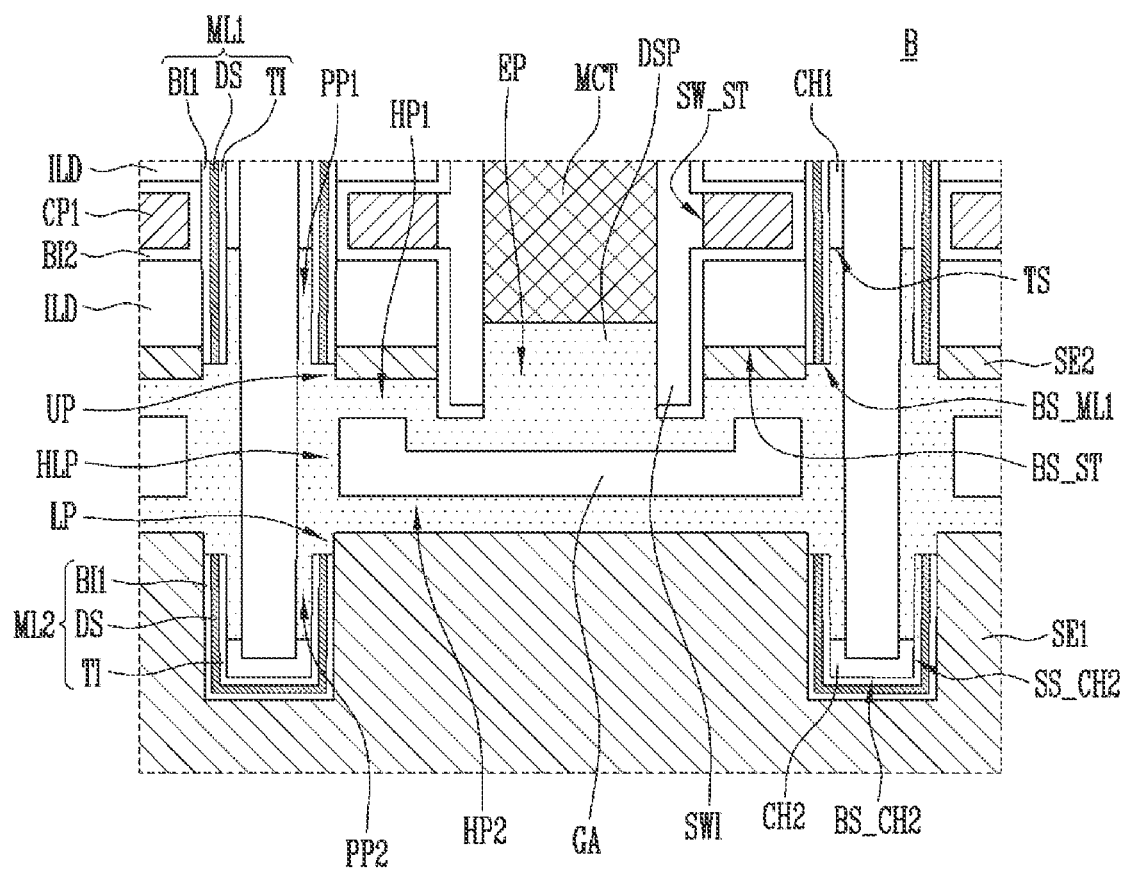

FIGS. 2A and 2B are cross-sectional diagrams illustrating a part of the semiconductor memory device 10 shown in FIG. 1.

FIG. 2A is a cross-sectional diagram illustrating the memory string A shown in FIG. 1.

Referring to FIG. 2A, the conductive patterns CP1 to CPn may serve as source select lines SSL1 and SSL2, word lines WL1 to WLk, and drain select lines DSL1 and DSL2. For example, one or more conductive patterns adjacent to the doped semiconductor pattern DSP, for example, CP1 and CP2, among the conductive patterns CP1 to CPn may serve as the source select lines SSL1 and SSL2. One or more conductive patterns adjacent to the upper doped semiconductor pattern UDP, for example, CPn and CPn−1, among the conductive patterns CPn to CPn may serve as the drain select lines DSL1 and DSL2. The word lines WL1 to WLk may be disposed between the source select lines SSL1 and SSL2 and the drain select lines DSL1 and DSL2.

Source select transistors SST1 and SST2 may be defined at intersections of the first channel pattern CH1 and the source select lines SSL1 and SSL2. Drain select transistors DST1 and DST2 may be defined at intersections of the first channel pattern CH1 and the drain select lines DSL1 and DSL2. Memory cells MC1 to MCk may be defined at intersections of the first channel pattern CH1 and the word lines WL1 to WLk. The first channel pattern CH1 may couple the source select transistors SST1 and SST2 in series, couple the drain select transistors DST1 and DST2 in series, and couple the memory cells MC1 to MCk in series.

The conductive patterns CP1 to CPn may include at least one of silicon, metal and metal silicide.

FIG. 2B is an enlarged cross-sectional diagram of region B shown in FIG. 1.

Referring to FIG. 2B, each of the first memory pattern ML1 and the second memory pattern ML2 may include a tunnel insulating layer TI, a data storage layer DS surrounding the tunnel insulating layer TI, and a first blocking insulating layer BI1 surrounding the data storage layer DS. The tunnel insulating layer TI may include an insulating material enabling charge tunneling. For example, the tunnel insulating layer TI may include a silicon oxide layer. The data storage layer DS may include various materials capable of storing data that is changed by a voltage difference between the word lines WL1 to WLk and the first channel pattern CH1 as described above with reference to FIG. 2A. For example, the data storage layer DS may include a nitride layer enabling charge trapping. In addition, the data storage layer DS may include nanodots or may include a phase change material capable of changing resistance. The first blocking insulating layer BI1 may include an oxide layer capable of blocking charges.

A second blocking insulating layer BI2 may be formed between each of the conductive patterns CP1 to CPn and the first memory pattern ML1 shown in FIGS. 1 and 2A. The second blocking insulating layer BI2 may extend between each of the conductive patterns CP1 to CPn and the interlayer insulating layer ILD adjacent to each of the conductive patterns CP1 to CPn shown in FIGS. 1 and 2A. The second blocking insulating layer BI2 may extend between the interlayer insulating layers ILD and the sidewall insulating layer SWI. The sidewall insulating layer SWI may be formed on the sidewall ST_SW of the gate stack structure. The second blocking insulating layer BI2 may include a high dielectric layer such as an aluminum oxide layer or a hafnium oxide layer. According to an embodiment, one of the first blocking insulating layer BI1 and the second blocking insulating layer BI2 may be omitted.

Figure 3:
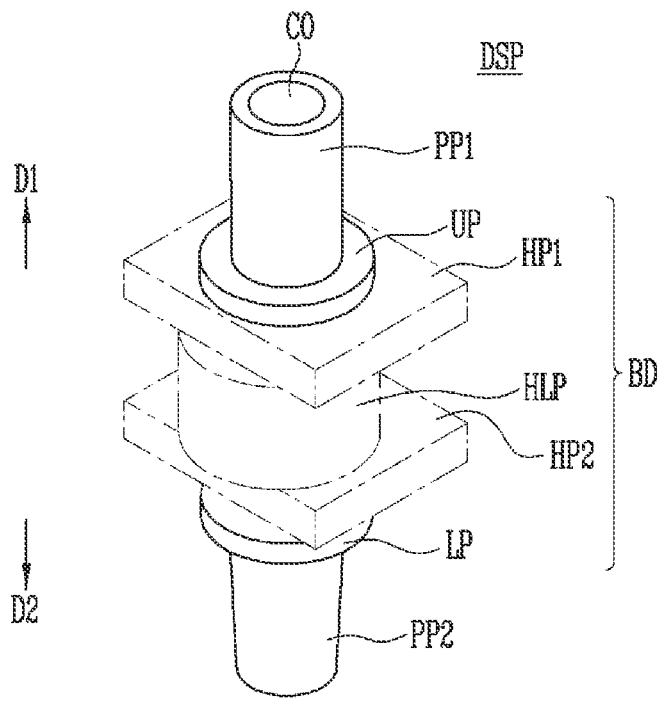
FIG. 3 is a perspective view illustrating a doped semiconductor pattern according to an embodiment.

FIG. 3 is a perspective view illustrating the doped semiconductor pattern DSP according to an embodiment. Hereinafter, the first direction described above with reference to FIG. 1 is denoted by the reference numeral "D1" in FIG. 3. A direction opposite to the first direction D1 is denoted by a second direction D2 in FIG. 3.

Referring to FIGS. 2B and 3, the doped semiconductor pattern DSP may include a body portion BD, a first protrusion PP1 and a second protrusion PP2 which protrude from the body portion BD in opposite directions to each other, and an extending portion EP extending from the body portion BD to the sidewall insulating layer SWI. In an embodiment, portions of the extending portion EP may contact the sidewall insulating layer SWI.

The body portion BD of the doped semiconductor pattern DSP may include a first horizontal pattern HP1 and a second horizontal pattern HP2 which extend in parallel with each other, and a coupling pattern HLP extending from the first horizontal pattern HP1 towards the second horizontal pattern HP2. In addition, the body portion BD may include an upper pattern UP extending from the first protrusion PP1 along the bottom surface BS_ML1 of the first memory pattern ML1 and a lower pattern LP extending from the second protrusion PP2 along the top surface of the second memory pattern ML2.

The first horizontal pattern HP1 may extend in parallel with the bottom surface BS_ST of the gate stack structure GST and the bottom surface of the second semiconductor layer SE2 shown in FIG. 1. The first horizontal pattern HP1 may extend from the upper pattern UP and may be disposed on a plane perpendicular to a first axis and a second axis respectively parallel to the first direction D1 and the second direction D2. In an embodiment, the first horizontal pattern HP1 may extend in parallel with the bottom surface BS_ST of the gate stack structure GST.

The second horizontal pattern HP2 may extend in parallel with the top surface of the first semiconductor layer SE1. The second horizontal pattern HP2 may extend from the lower pattern LP and may be disposed on a plane perpendicular to the first direction D1 and the second direction D2.

The coupling pattern HLP may extend from the first horizontal pattern HP1 in the second direction D2 to be coupled to the second horizontal pattern HP2.

The second horizontal pattern HP2 of the body portion BD may be in contact with the first semiconductor layer SEL. The second semiconductor layer SE2 disposed between the gate stack structure GST and the body portion BD as shown in FIG. 1 may be in contact with the first horizontal pattern HP1.

The first protrusion PP1 may protrude from the body portion BD in the first direction D1. The first protrusion PP1 may be in contact with the first channel pattern CH1. The first channel pattern CH1 may be disposed on the top surface TS of the first protrusion PP1 and may extend in the first direction D1. The first memory pattern ML1 surrounding the sidewall of the first channel pattern CH1 may extend on the sidewall of the first protrusion PP1. In an embodiment, the first memory pattern ML1 surrounding the sidewall of the first channel pattern CH1 may be extended to surround the sidewall of the first protrusion PP1. In an embodiment, a first portion of the first memory pattern ML1 may surround the sidewall of the first channel pattern CH1 and a second portion of the first memory pattern ML1 may extend from the first portion of the first memory pattern ML1 to surround the sidewall of the first protrusion PP1.

The second protrusion PP2 may protrude from the body portion BD in the second direction D2. The second protrusion PP2 may be in contact with the second channel pattern CH2. The second channel pattern CH2 may be disposed on the bottom surface of the second protrusion PP2 and may extend on the bottom surface of the core insulating layer CO. The sidewall of the second protrusion PP2 may be surrounded by the second memory pattern ML2. The second memory pattern ML2 may extend on the surface of the second channel pattern CH2. The second memory pattern ML2 may be surrounded by the first semiconductor layer SE1. In an embodiment, a first portion of a second memory pattern ML2 may surround a sidewall of the second protrusion PP2 and a second portion of the second memory pattern ML2 may extend from the first portion to surround a bottom surface BS_CH2 of the second channel pattern CH2 and a side surface SS_CH2 of the second channel pattern CH2.

The first protrusion PP1, the second protrusion PP2, and the body portion BD may surround the sidewall of the core insulating layer CO which is in contact with the first protrusion PP1, the second protrusion PP2, and the body portion BD. The upper pattern UP may laterally protrude farther than the first protrusion PP1 and the first horizontal pattern HP1 may laterally protrude farther than the upper pattern UP. The lower pattern LP may laterally protrude farther than the second protrusion PP2 and the second horizontal pattern HP2 may laterally protrude farther than the lower pattern LP. According to the structure as described above, a stepwise structure may be defined on the sidewall of the doped semiconductor pattern DSP. In an embodiment, a first stepwise structure may be defined by the first protrusion PP1, the upper pattern UP and the first horizontal pattern HP1. In an embodiment, a second stepwise structure may be defined by the second protrusion PP2, the lower pattern LP and the second horizontal pattern HP2.

According to an embodiment, an abrupt junction may be formed through the doped semiconductor pattern DSP. Accordingly, gate induced drain leakage (GIDL) generation efficiency may be increased during an erase operation on a semiconductor memory device using a GIDL method.

Figure 4:
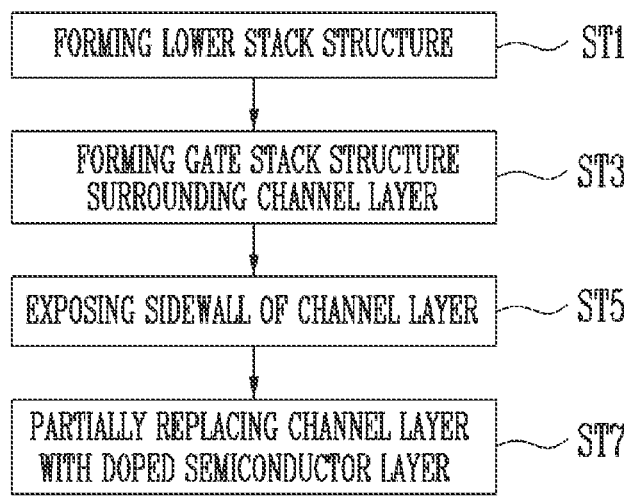
FIG. 4 is a schematic flowchart illustrating a method of manufacturing a semiconductor memory device according to an embodiment.

FIG. 4 is a schematic flowchart illustrating a method of manufacturing a semiconductor memory device according to an embodiment.

Referring to FIG. 4, a method of manufacturing a semiconductor memory device may include step ST1 for forming a lower stack structure, step ST3 for forming a gate stack structure surrounding a channel layer, step ST5 for exposing a sidewall of the channel layer, and step ST7 for replacing a part of the channel layer by a doped semiconductor layer.

FIGS. 5A to 5D are cross-sectional diagrams illustrating an embodiment regarding steps ST1 and ST3 shown in FIG. 4.

Figure 5A:
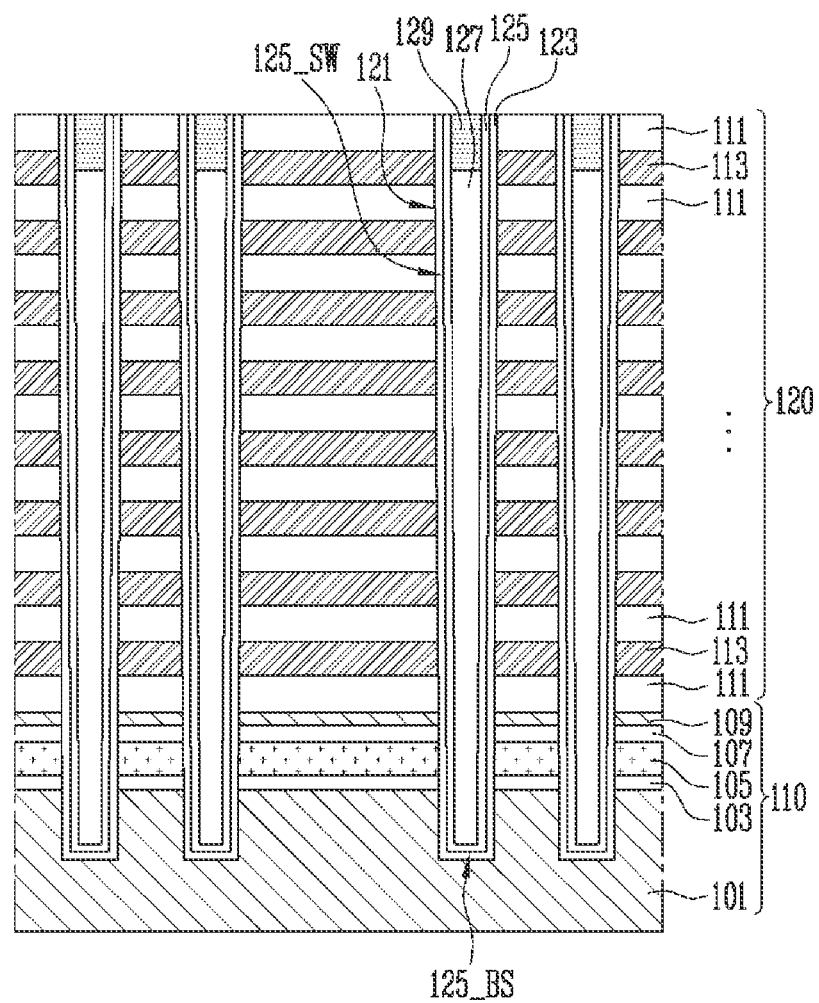

Referring to FIG. 5A, step ST1 shown in FIG. 4 may include forming a sacrificial layer 105 over a first semiconductor layer 101. A lower stack structure 110 may further include at least one of a first protective layer 103 disposed between the first semiconductor layer 101 and the sacrificial layer 105 and a second protective layer 107 disposed on the sacrificial layer 105. The lower stack structure 110 may further include a second semiconductor layer 109 disposed over the sacrificial layer 105 and the second protective layer 107.

The first semiconductor layer 101 may include a doped semiconductor layer or an undoped semiconductor layer. The first semiconductor layer 101 as a doped semiconductor layer may include at least one of an n-type dopant and a p-type dopant. For example, the first semiconductor layer 101 may include doped silicon.

The second semiconductor layer 109 may include a material having a different etch rate from an oxide layer and a nitride layer. According to an embodiment, the second semiconductor layer 109 may include silicon. The second semiconductor layer 109 may be a doped layer including various impurities such as an n-type impurity, a p-type impurity, or carbon, or may be an undoped layer.

The first protective layer 103 and the second protective layer 107 may include a different material from the first semiconductor layer 101 and the second semiconductor layer 109. For example, the first protective layer 103 and the second protective layer 107 may include an oxide layer.

The sacrificial layer 105 may include a material having a different etch rate from the first protective layer 103 and the second protective layer 107. For example, the sacrificial layer 105 may include undoped silicon.

Step ST3 shown in FIG. 4 may include forming a preliminary stack structure 120 on the lower stack structure 110. The preliminary stack structure 120 may include first material layers 111 and second material layers 113 alternately stacked on each other one by one.

The second material layers 113 may include a different material from the first material layers 111. According to an embodiment, the first material layers 111 may include an insulating material which may serve as an interlayer Insulating layer and the second material layers 113 may include a conductive material which may serve as a conductive pattern. According to other embodiments, the first material layers 111 may include an insulating material which may serve as an interlayer insulating layer and the second material layers 113 may include a sacrificial material having a different etch rate from the first material layers 111. For example, the first material layers 111 may include a silicon oxide layer and the second material layers 113 may include a silicon nitride layer. According to other embodiments, the first material layers 111 may include a sacrificial material having a different etch rate from the second material layers 113, and the second material layers 113 may include a conductive material which may serve as a conductive pattern. For example, the first material layers 111 may include an undoped silicon layer and the second material layers 113 may include a doped silicon layer or a metal layer. Examples in which the first material layers 111 include an insulating material which may serve as an interlayer Insulating layer and the second material layers 113 include a sacrificial material having a different etch rate from the first material layers 111 are illustrated in FIGS. 5A to 5D. However, embodiments are not limited thereto.

Step ST3 shown in FIG. 4 may include forming a channel hole 121 which passes through the preliminary stack structure 120 and extends into the lower stack structure 110. The channel hole 121 may pass through the second semiconductor layer 109, the second protective layer 107, the sacrificial layer 105, and the first protective layer 103 of the lower stack structure 110 and may extend into the first semiconductor layer 101.

Step ST3 shown in FIG. 4 may include forming a memory layer 123 on the surface of the channel hole 121, forming a channel layer 125 on the memory layer 123, and filling the central area of the channel hole 121 which is opened by the channel layer 125 by a core insulating layer 127 and an upper doped semiconductor pattern 129.

Figure 6A:
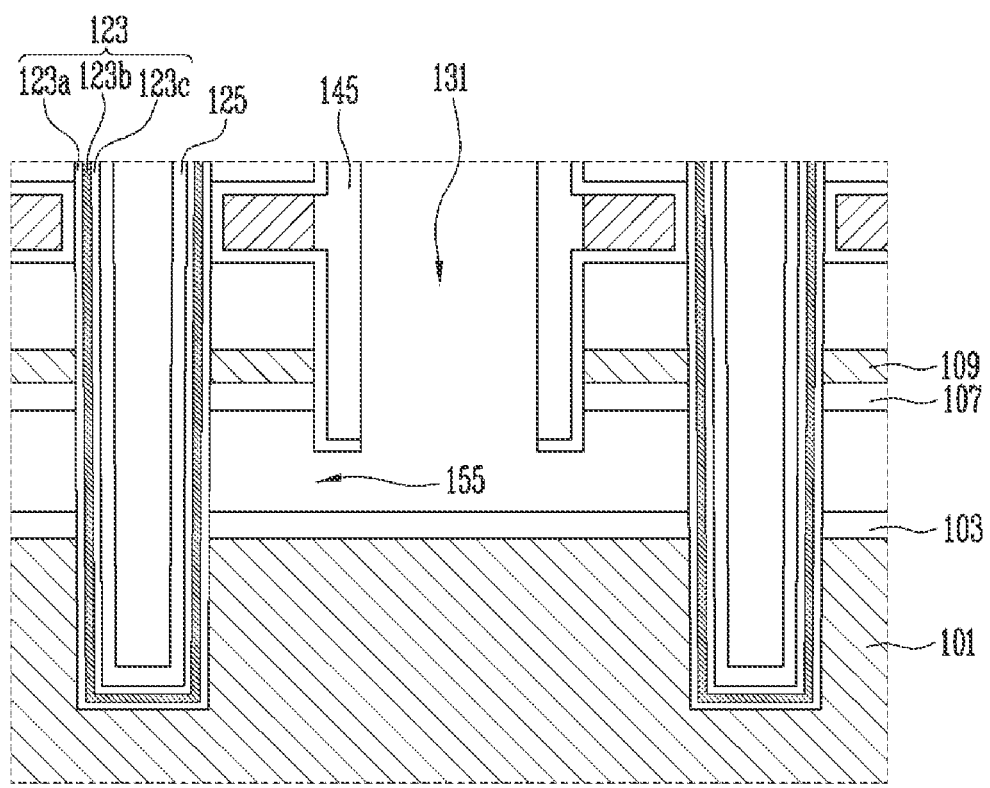
FIGS. 6A, 6B, 6C, and 6D are cross-sectional diagrams illustrating an embodiment regarding steps ST5 and ST7 shown in FIG. 4.

The memory layer 123 may include a first blocking insulating layer 123a, a data storage layer 123b, and a tunnel insulating layer 123c to be shown in FIG. 6A. Each of the first blocking insulating layer 123a, the data storage layer 123b, and the tunnel insulating layer 123c may extend along the surface of the channel hole 121. The first blocking insulating layer 123a, the data storage layer 123b, and the tunnel insulating layer 123c may include materials of the first blocking insulating layer BI1, the data storage layer DS, and the tunnel insulating layer TI described above with reference to FIG. 2B, respectively.

The channel layer 125 may extend along the surface of the memory layer 123. The bottom surface 125_BS and the sidewall 125_SW of the channel layer 125 may be covered by the memory layer 123. The channel layer 125 may upwardly protrude from the inside of the first semiconductor layer 101 farther than the lower stack structure 110. The channel layer 125 may open the central area of the channel hole 121. The channel layer 125 may include a semiconductor. For example, the channel layer 125 may include undoped silicon.

The core insulating layer 127 may fill a lower portion of the central area of the channel hole 121 opened by the channel layer 125. In other words, the core insulating layer 127 may be lower than the channel layer 125. The upper doped semiconductor pattern 129 may be disposed on the core insulating layer 127 and may fill an upper portion of the central area of the channel hole 121. The upper doped semiconductor pattern 129 may include a conductive dopant. For example, the upper doped semiconductor pattern 129 may include an n-type dopant. For example, the upper doped semiconductor pattern 129 may include doped silicon.

Referring to FIG. 5B, step ST3 shown in FIG. 4 may include forming a slit 131. The slit 131 may pass through the preliminary stack structure 120, the second semiconductor layer 109, and the second protective layer 107 shown in FIG. 5A.

An etching process for forming the slit 131 may be stopped when the sacrificial layer 105 is exposed. The slit 131 may extend into the sacrificial layer 105. Accordingly, the bottom surface of the slit 131 may be coplanar with an etched surface of the sacrificial layer 105.

Subsequent processes may be performed by various methods according to properties of first material layers and second material layers. According to an embodiment, step ST3 may include replacing the second material layers 113 shown in FIG. 5A by conductive patterns 143 to be shown in FIG. 5D through the slit 131.

Replacing the second material layers by the conductive patterns may include selectively removing the second material layers 113 shown in FIG. 5A through the slit 131. Accordingly, first openings 133 may be defined between the first material layers 111 as illustrated in FIG. 5B.

Figure 5C:
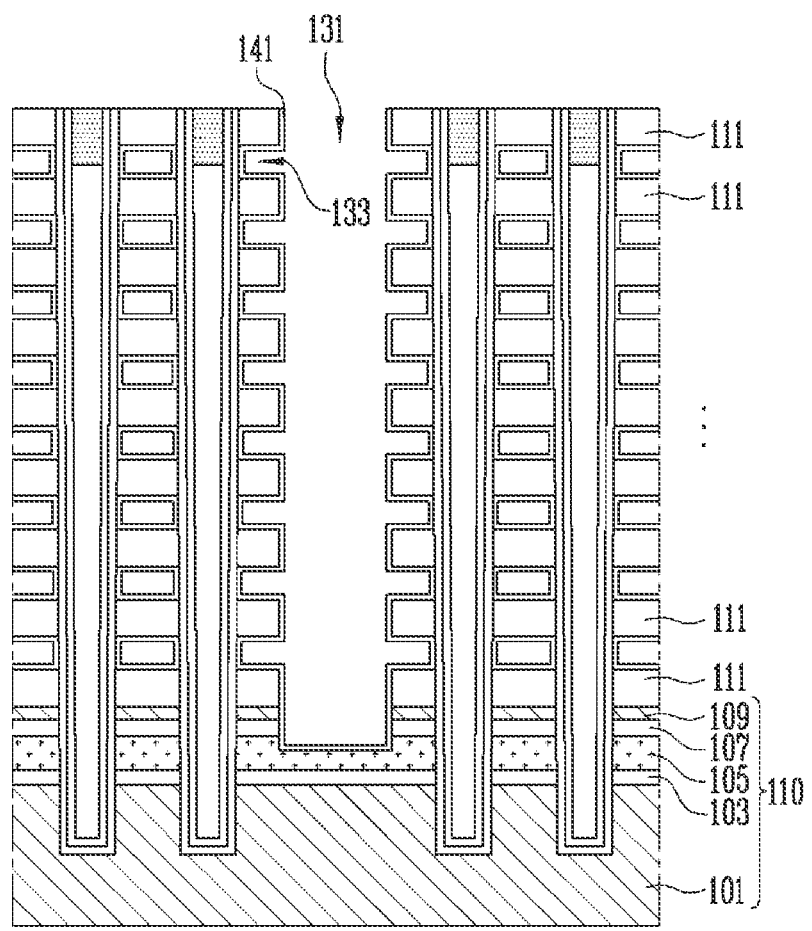

Referring to FIG. 5C, a second blocking insulating layer 141 may be formed on a surface of each of the first openings 133. The second blocking insulating layer 141 may extend on sidewalls of the first material layers 111 which face the slit 131 and may extend on the bottom surface of the slit 131.

Figure 5D:
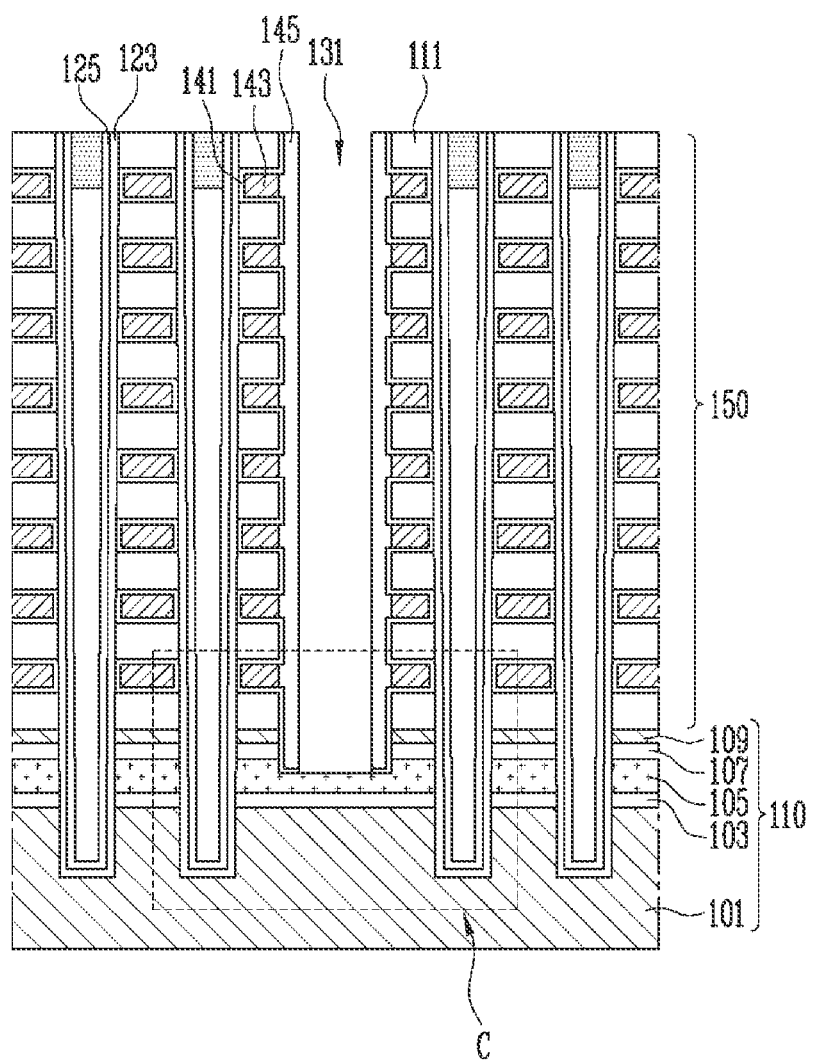

Referring to FIG. 5D, replacing the second material layers by the conductive patterns may include forming the conductive patterns 143 in the first openings 133 shown in FIG. 5C.

According to an embodiment, forming the conductive patterns 143 may include forming a barrier metal layer extending along surfaces of the first openings 133, filling the first openings 133 shown in FIG. 5C with a conductive layer, and separating the barrier metal layer and the conductive layer into the conductive patterns 143 by etching the barrier metal layer and the conductive layer. Accordingly, a gate stack structure 150 including the conductive patterns 143 and the first material layers 111 may be formed on the lower stack structure 110.

According to other embodiments, when the first material layers 111 shown in FIG. 5A include an insulating material for an interlayer insulating layer and the second material layers 113 shown in FIG. 5A include a conductive material for the conductive patterns 143, replacing the second material layers 113 through the slit 131 may be skipped, and the first material layers 111 and the second material layers 113 may form a gate stack structure.

According to other embodiments, when the first material layers 111 shown in FIG. 5A include a sacrificial material and the second material layers 113 shown in FIG. 5A include a conductive material for the conductive patterns 143, the first material layers 111 may be replaced by interlayer insulating layers through the slit 131 and the interlayer insulating layers and the second material layers 113 may form a gate stack structure.

As stated above, according to various embodiments, the gate stack structure 150 surrounding the channel layer 125 may be formed on the lower stack structure 110. The channel layer 125 may have the outer wall protruding above the lower stack structure 110 and surrounded by the memory layer 123.

Subsequently, a sidewall insulating layer 145 may be formed on the sidewall of the slit 131. Accordingly, sidewalls of the conductive patterns 143 which face the slit 131 may be covered by the sidewall insulating layer 145. The second blocking insulating layer 141 disposed on the bottom surface of the slit 131 may be partially removed to expose the sacrificial layer 105 of the lower stack structure 110.

FIGS. 6A to 6D are cross-sectional diagrams illustrating an embodiment regarding steps ST5 and ST7 shown in FIG. 4. FIGS. 6A to 6D are enlarged cross-sectional diagrams illustrating region C shown in FIG. 5D.

Referring to FIG. 6A, step ST5 shown in FIG. 4 may include removing the sacrificial layer 105 of the lower stack structure 110 shown in FIG. 5D through the slit 131. Accordingly, a second opening 155 may be defined between the first protective layer 103 and the second protective layer 107.

The second opening 155 may partially expose the memory layer 123 between the gate stack structure 150 and the first semiconductor layer 101 shown in FIG. 5D. When the second opening 155 is formed, the second semiconductor layer 109 may be protected by the sidewall insulating layer 145.

Figure 6B:
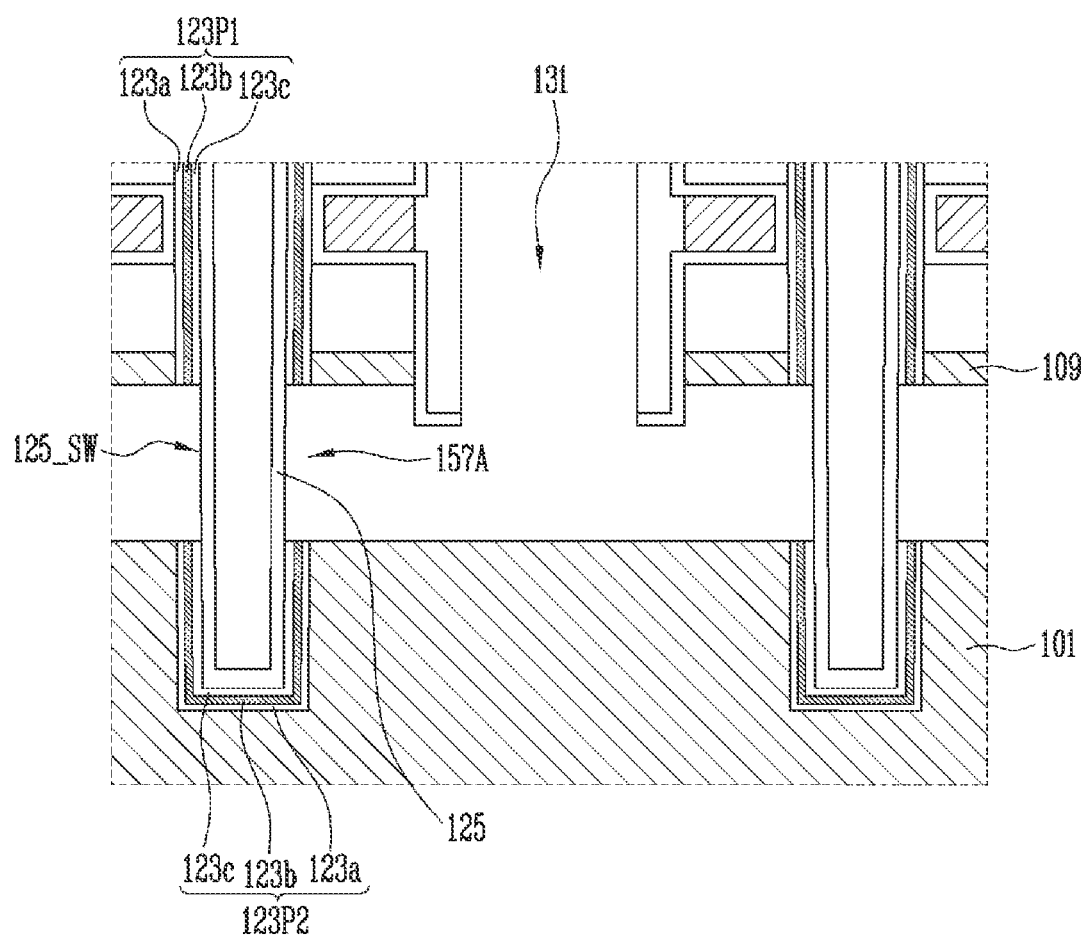

Referring to FIG. 6B, step ST5 shown in FIG. 4 may include forming a third opening 157A exposing the sidewall 125_SW of the channel layer 125 by sequentially etching the first blocking insulating layer 123a, the data storage layer 123b, and the tunnel insulating layer 123c which are exposed through the second opening 155 shown in FIG. 6A. A memory layer including the first blocking insulating layer 123a, the data storage layer 123b, and the tunnel insulating layer 123c may be separated into a first memory pattern 123P1 and a second memory pattern 123P2 by the third opening 157A.

The first memory pattern 123P1 may be defined as a pattern remaining between the gate stack structure 150 and the channel layer 125 shown in FIG. 5D. The second memory pattern 123P2 may be defined as a pattern remaining between the first semiconductor layer 101 and the channel layer 125.

When the third opening 157A is formed, the first protective layer 103 and the second protective layer 107 shown in FIG. 6A may be removed.

Figure 6C:
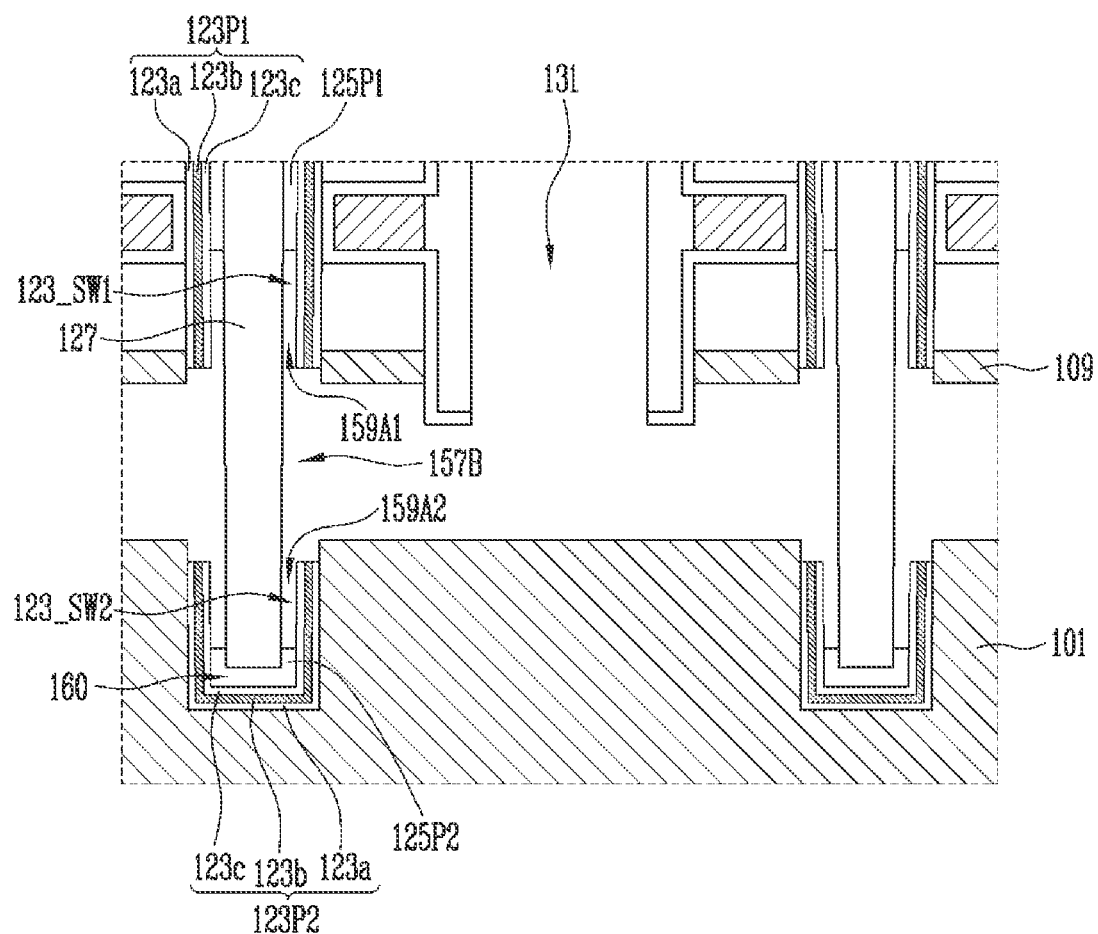

Referring to FIG. 6C, step ST7 shown in FIG. 4 may include partially etching the channel layer exposed through the third opening 157A shown in FIG. 6B. Each of the first memory pattern 123P1 and the second memory pattern 123P2 may be partially etched to extend the third opening. An extended third opening 157B may be coupled to a first groove 159A1 and a second groove 159A2 which are defined by partially etching the channel layer 125.

The first groove 159A1 may be disposed between the first memory pattern 123P1 and the core insulating layer 127 to open the sidewall 123_SW1 of the first memory pattern 123P1. The first groove 159A1 may face the sidewall of the gate stack structure 150 shown in FIG. 5D with the first memory pattern 123P1 interposed therebetween. When the channel layer is etched, the first memory pattern 123P1 may serve as a protective layer such that the lowermost conductive pattern among the conductive patterns 143 of the gate stack structure 150 shown in FIG. 5D is not exposed.

The second groove 159A2 may be disposed between the second memory pattern 123P2 and the core insulating layer 127 to open the sidewall 123_SW2 of the second memory pattern 123P2.

Partially etching the channel layer may be performed such that the channel layer is separated into a first channel pattern 125P1 disposed on the sidewall 123_SW1 of the first memory pattern 123P1 and a second channel pattern 125P2 disposed on the sidewall 123_SW2 of the second memory pattern 123P2 by the first groove 159A1 and the second groove 159A2.

Figure 6D:
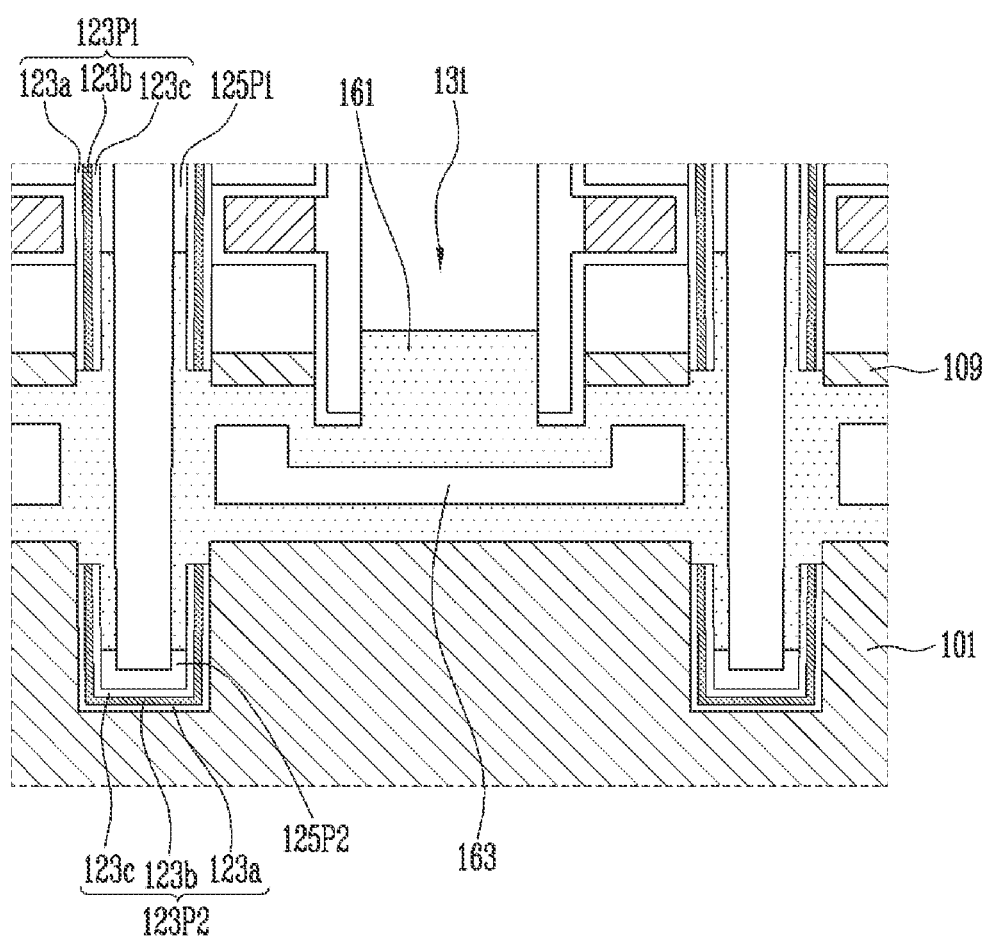

Referring to FIG. 6D, step ST7 shown in FIG. 4 may include forming a doped semiconductor pattern 161 filling the first groove 159A1 and the second groove 159A2 shown in FIG. 6C. The doped semiconductor pattern 161 may be in contact not only with each of the first channel pattern 125P1, the second channel pattern 125P2, and the first semiconductor layer 101 but also with the second semiconductor layer 109 penetrated by the slit 131.

The doped semiconductor pattern 161 may include a conductive dopant for a source junction. For example, the doped semiconductor pattern 161 may include an n-type dopant. According to an embodiment, the doped semiconductor pattern 161 may include doped silicon.

Because the doped semiconductor pattern 161 fills the first groove 159A1 shown in FIG. 6C, the doped semiconductor pattern 161 may face the sidewall of the gate stack structure 150 shown in FIG. 5D with the first memory pattern 123P1 interposed therebetween.

According to an embodiment, the doped semiconductor pattern 161 may be disposed to be adjacent to the lowermost conductive pattern among the conductive patterns 143 of the gate stack structure 150 shown in FIG. 5D by controlling an etching amount of the channel layer. Accordingly, even when diffusing the dopant into the channel layer by applying heat which has a high temperature is omitted, a junction overlap area with respect to a source select transistor coupled to the lowermost conductive pattern may be formed. The junction overlap area according to an embodiment may be secured by controlling an etching amount of the channel layer. Accordingly, the present embodiments may reduce a heat process and the junction overlap area may easily be controlled.

According to an embodiment where a junction overlap area is secured by controlling an etching amount of a channel layer, a length of the junction overlap area may be controlled more precisely compared to a case where a junction overlap area is secured by diffusing a dopant into a channel layer by a high-temperature heat process. Accordingly, according to an embodiment, off characteristics of the source select transistors SST1 and SST2 may be ensured even when the number of stacked source select lines SSL1 and SSL2 which are disposed between the word lines WL1 to WLk and the first semiconductor layer SE1 shown in FIG. 2A is not increased.

Replacing the second material layers by the conductive patterns as described above with reference to FIGS. 5B to 5D may be performed at a high temperature. The doped semiconductor pattern 161 may be formed after forming the conductive patterns, which requires a high temperature, is performed. Accordingly, degradation in characteristics of a semiconductor memory device which are caused when a dopant in the doped semiconductor pattern 161 is diffused by a high temperature may be reduced.

According to an embodiment, the doped semiconductor pattern 161 may fill an area from which the channel layer is etched. Even when the doped semiconductor pattern 161 is disposed to be adjacent to the lowermost conductive pattern among the conductive patterns 143 shown in FIG. 5D, failure in which the lowermost conductive pattern and the doped semiconductor pattern 161 are coupled together through the first memory pattern 123P1 may be mitigated according to an embodiment.

A height of the doped semiconductor pattern 161 to remain may be controlled by an etching process, and the doped semiconductor pattern 161 may remain in a lower portion of the slit 131. When the doped semiconductor pattern 161 is formed, a gap 163 may be defined in the doped semiconductor pattern 161 and the gap 163 may be isolated from the slit 131 by the doped semiconductor pattern 161.

Figure 7:
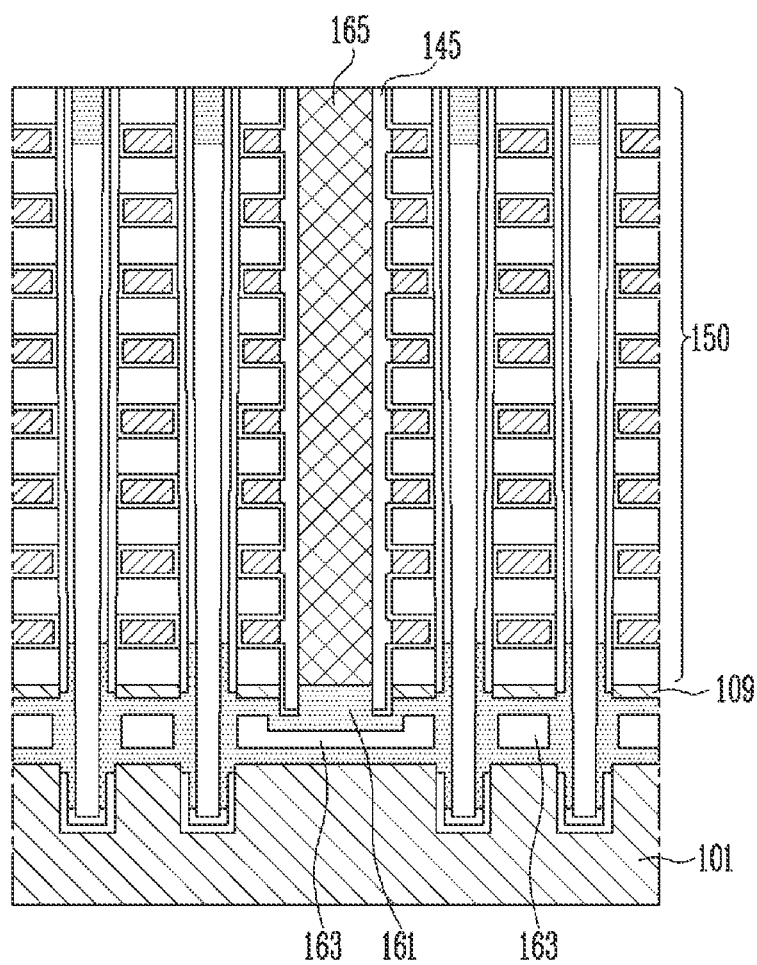
FIG. 7 is a cross-sectional diagram illustrating an embodiment regarding a subsequent process which is performed after step ST7 shown in FIG. 4.

FIG. 7 is a cross-sectional diagram illustrating an embodiment regarding a subsequent process which is performed after step ST7 shown in FIG. 4.

Referring to FIG. 7, the slit 131 shown in FIG. 6D may be filled with a metal contact pattern 165. According to other embodiments, the slit 131 may be filled with an insulating material.

Figure 8:
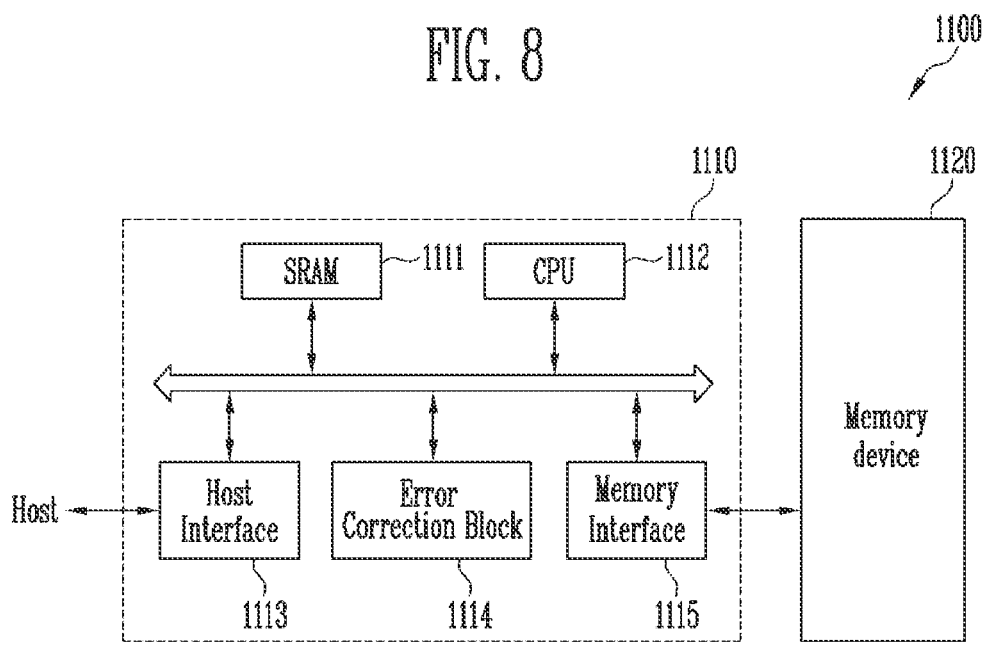
FIG. 8 is a block diagram illustrating a configuration of a memory system according to an embodiment.

FIG. 8 is a block diagram illustrating a configuration of a memory system 1100 according to an embodiment.

Referring to FIG. 8, the memory system 1100 according to an embodiment may include a memory device 1120 and a memory controller 1110.

The memory device 1120 may include the structures as described above with reference to FIGS. 1, 2A, 2B, and 3. For example, the memory device 1120 may include a channel pattern surrounded by a gate stack structure and a doped semiconductor pattern including a protrusion extending towards the channel pattern. The memory device 1120 may be a multi-chip package including a plurality of flash memory chips.

The memory controller 1110 may be configured to control the memory device 1120 and may include Static Random Access Memory (SRAM) 1111, Central Processing Unit (CPU) 1112, a host interface 1113, an error correction block 1114, and a memory interface 1115. The SRAM 1111 may serve as an operation memory of the CPU 1112, the CPU 1112 may perform general control operations for data exchange of the memory controller 1110, and the host interface 1113 may include a data exchange protocol of a host accessing the memory system 1100. In addition, the error correction block 1114 may detect and correct errors included in data read from the memory device 1120, and the memory interface 1115 may perform interfacing with the memory device 1120. In addition, the memory controller 1110 may further include Read Only Memory (ROM) for storing code data for interfacing with the host.

The memory system 1100 having the above-described configuration may be a memory card or a Solid State Drive (SSD) in which the memory device 1120 and the memory controller 1110 are combined. For example, when the memory system 1100 is an SSD, the memory controller 1110 may communicate with an external device (e.g., a host) through one of various interface protocols including a Universal Serial Bus (USB), a MultiMedia Card (MMC), Peripheral Component Interconnection-Express (PCI-E), Serial Advanced Technology Attachment (SATA), Parallel Advanced Technology Attachment (PATA), a Small Computer Small Interface (SCSI), an Enhanced Small Disk Interface (ESDI), and Integrated Drive Electronics (IDE).

Figure 9:
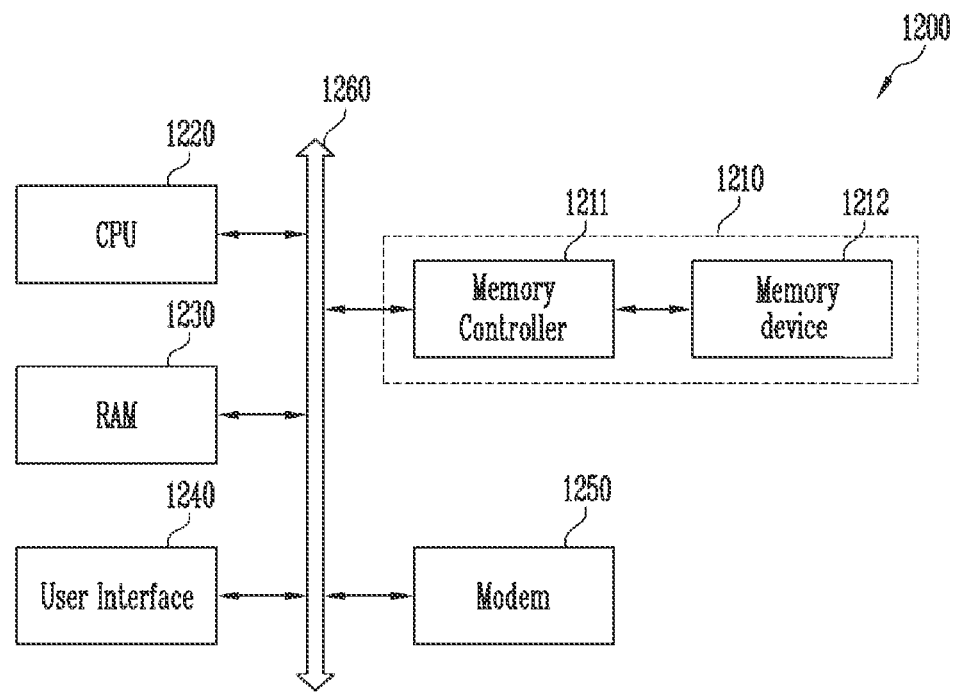
FIG. 9 is a block diagram illustrating a configuration of a computing system according to an embodiment.

FIG. 9 is a block diagram illustrating the configuration of a computing system 1200 according to an embodiment of the present disclosure.

Referring to FIG. 9, the computing system 1200 according to an embodiment may include a CPU 1220, Random Access Memory (RAM) 1230, a user interface 1240, a modem 1250, and a memory system 1210 that are electrically coupled to a system bus 1260. In addition, when the computing system 1200 is a mobile device, a battery for supplying an operating voltage to the computing system 1200 may be further included, an application chipset, a camera image processor (CIS), a mobile DRAM, and the like may be further included.

The memory system 1210 may include a memory device 1212 and a memory controller 1211.

As described above, according to the present disclosure, the operational reliability of a semiconductor memory device may be improved through a protrusion of a doped semiconductor pattern extending towards a channel pattern.

According to the present disclosure, a junction overlap as to a source select transistor may be easily controlled and process failure may be reduced by replacing a part of a channel layer by a doped semiconductor pattern.

What is claimed is:

1. A method of manufacturing a semiconductor memory device, the method comprising:
    forming a lower stack structure including a first semiconductor layer and a sacrificial layer which is disposed over the first semiconductor layer;
    forming a channel layer extending from an inside of the first semiconductor layer to pass through the sacrificial layer and having a sidewall and a bottom surface covered by a memory layer, wherein the channel layer protrudes farther than the lower stack structure;
    forming a gate stack structure on the lower stack structure to surround the channel layer;
    removing the sacrificial layer to expose a part of the memory layer between the gate stack structure and the first semiconductor layer;
    removing the part of the memory layer to separate the memory layer into a first memory pattern between the gate stack structure and the channel layer and a second memory pattern between the first semiconductor layer and the channel layer; and
    replacing a part of the channel layer exposed between the first memory pattern and the second memory pattern by a doped semiconductor pattern.

2. The method of claim 1, wherein the replacing of the part of the channel layer by the doped semiconductor pattern comprises:
    etching the part of the channel layer to define a first groove which opens a sidewall of the first memory pattern; and
    forming the doped semiconductor pattern filling the first groove and being in contact with the channel layer and the first semiconductor layer.

3. The method of claim 2, wherein a second groove which opens a sidewall of the second memory pattern is defined when the part of the channel layer is etched, and
    wherein the doped semiconductor pattern fills the second groove.

4. The method of claim 2, wherein the first groove faces a sidewall of the gate stack structure with the first memory pattern interposed between the first groove and the sidewall of the gate stack structure, and
    wherein the doped semiconductor pattern faces the sidewall of the gate stack structure with the first memory pattern interposed between the doped semiconductor pattern and the sidewall of the gate stack structure.

5. The method of claim 1, wherein the forming of the channel layer having the sidewall and the bottom surface covered by the memory layer comprises:
    forming a preliminary stack structure including first material layers and second material layers alternately stacked on each other on the lower stack structure;
    forming a channel hole passing through the preliminary stack structure and the sacrificial layer and extending into the first semiconductor layer;
    forming the memory layer on a surface of the channel hole;
    forming the channel layer on the memory layer; and
    filling a central area of the channel hole opened by the channel layer with a core insulating layer.

6. The method of claim 5, wherein the forming of the gate stack structure comprises:
    forming a slit passing through the preliminary stack structure;
    replacing the second material layers by conductive patterns through the slit; and
    forming a sidewall insulating layer on a sidewall of the slit to cover sidewalls of the conductive patterns.

7. The method of claim 5, wherein the replacing of the part of the channel layer by the doped semiconductor pattern comprises:
    etching the part of the channel layer to define a first groove between the first memory pattern and the core insulating layer; and
    forming the doped semiconductor pattern filling the first groove and being in contact with the channel layer and the first semiconductor layer.

8. The method of claim 7, wherein a second groove is defined between the second memory pattern and the core insulating layer when the part of the channel layer is etched, and
    wherein the doped semiconductor pattern fills the second groove.

9. The method of claim 1, wherein the channel layer is separated into a first channel pattern disposed on a sidewall of the first memory pattern and a second channel pattern disposed on a sidewall of the second memory pattern by the doped semiconductor pattern.

* * * * *